United States Patent [19]

Nakagawa

[11] Patent Number: 5,286,209
[45] Date of Patent: Feb. 15, 1994

[54] IC SOCKET

[75] Inventor: Hiroshi Nakagawa, Itami, Japan

[73] Assignee: Mitsubishi Denki Kabushiki Kaisha, Tokyo, Japan

[21] Appl. No.: 922,496

[22] Filed: Jul. 31, 1992

[30] Foreign Application Priority Data

Aug. 2, 1991 [JP] Japan .................... 3-193962

[51] Int. Cl.⁵ ............................ H01R 9/09
[52] U.S. Cl. ........................ 439/72; 439/331; 439/73
[58] Field of Search ................ 439/68-73, 439/259-269, 330, 331, 357, 358

[56] References Cited

U.S. PATENT DOCUMENTS

| | | | |
|---|---|---|---|
| 4,407,555 | 10/1983 | Lockard | 439/259 |
| 4,789,345 | 12/1988 | Carter | 439/266 |
| 4,824,389 | 4/1989 | Doyle et al. | 439/269 |
| 4,887,969 | 12/1989 | Abe | 439/73 |

*Primary Examiner*—Larry I. Schwartz
*Assistant Examiner*—Hien D. Vu
*Attorney, Agent, or Firm*—Leydig, Voit & Mayer

[57] ABSTRACT

An IC socket which can be used commonly in IC packages whose outer leads are different from each other. A receiving base having a stepped bottom surface on which an IC package is placed is movably disposed in a first hole of a main body portion of the IC socket. A sliding member having a stepped top surface is brought into abutment with the stepped bottom surface of the receiving base and is movably disposed in a second hole of the main body portion. By sliding the sliding member, the height of the receiving base can be changed in steps in accordance with the stepped bottom surface, making it possible to change the height of the receiving base according to the shape of the outer leads of an IC package placed on the receiving base.

7 Claims, 6 Drawing Sheets

IC SOCKET

BACKGROUND OF THE INVENTION

1. Field of the Invention

The present invention relates to an IC socket for use in functional testing and the like of an IC package.

2. Description of the Related Art

FIG. 11 is a perspective view illustrating a conventional IC socket. In this figure, a receiving base 2, which is formed in one piece with a main body portion 10 of an IC socket, is disposed in the center of the main body portion 10 of the IC socket. An IC package (not shown) is placed on the receiving base 2. A plurality of contactors 5 supported on the main body portion 10 are disposed on both sides of the receiving base 2. These contactors 5 have spring properties, and their top ends which extend toward the receiving base 2 make electrical contact with corresponding outer leads (not shown) extending from both sides of the package portion of an IC socket. A pressing lid 14 having a pressing member 3 is designed to hold an IC package against the receiving base 2.

When, for example, an IC package having regular bend leads, e.g., a SOP (Small Outline Package) type, in which outer leads are bent toward the bottom surface thereof, is placed on the receiving base 2, the IC package is positioned by the receiving base 2. Upon closure of the pressing lid 14, the outer leads of the IC package are pressed against the corresponding contactors 5 by the pressing member 3, thus causing the outer leads to make electrical contact with the contactors 5.

In the conventional IC socket described above, the height of the receiving base 2 is constant because the main body portion 10 and the receiving base 2 are formed in one piece. The shapes of the outer leads of IC packages include, in addition to the shape of a regular bend lead type, a flat lead type in which the outer leads extend horizontally from the package portion, and a reverse bend lead type in which the outer leads are bent upwardly. Thus, the height of the top end portion of the outer leads varies. Consequently, there is a problem in that it is not possible to use just one IC socket due to the fact that if the shape of the outer leads of IC packages having the same shape varies, the outer leads cannot make contact with the contactors 5.

If a reverse bend lead type package is turned upside down, the outer leads thereof have the same shape as that of the regular bend lead type. However, since the arrangement of the outer leads varies, the IC socket cannot be used in practice even if contact with the contactors 5 can be obtained.

SUMMARY OF THE INVENTION

The present invention has been achieved to solve the above-mentioned problems of the prior art.

An object of the present invention is to provide an IC socket which can be commonly used for packages of the same shape even if the outer leads have different shapes.

To this end, according to the present invention, there is provided an IC socket including: a main body portion; a receiving base, which is a supporting means movably, disposed in the main body portion and height adjustment means for changing the height of the receiving base in a stepped manner depending upon the type of the outer leads of the IC package. The height adjustment means includes a sliding member having a stepped bottom surface formed on the receiving base and a stepped top surface which is in abutment with the stepped bottom surface of the receiving base, which sliding member is disposed below the receiving base of the main body portion in such a manner as to be horizontally movable.

Pulling means for pulling the receiving base downward, i.e., toward the sliding member, is disposed so as to bring the stepped bottom surface of the receiving base into abutment with the stepped top surface of the sliding member, making it possible to reliably fix the receiving base onto the sliding member and to smoothly change the height of the receiving base.

In the IC socket of the present invention, the height of the receiving base changes depending upon which abutment surface of the stepped abutment surfaces of the stepped bottom surface of the receiving base the stepped top surface of the sliding member is brought into abutment with. This height is changed by sliding the sliding member. As a result, the height positional relationship between the receiving base and the contactors can be changed. In addition, by applying a downward pulling force to the receiving base, the receiving base is fixed on the sliding member more reliably, and changing of the height of the contactors can be performed smoothly.

DESCRIPTION OF THE PREFERRED EMBODIMENT

An embodiment of the present invention will be explained below with reference to the accompanying drawings.

Figure 1:
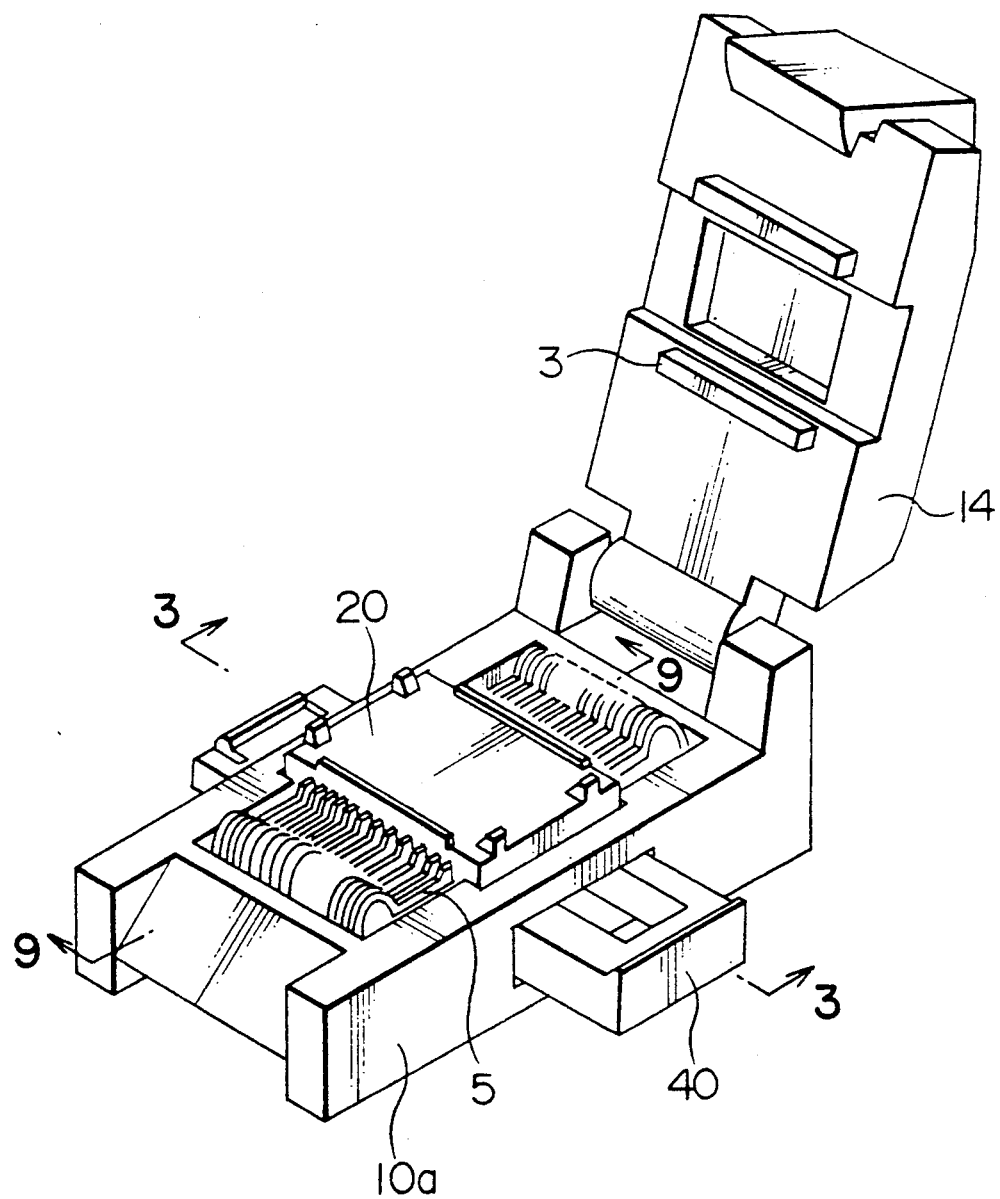
FIG. 1 is a perspective view of an IC socket according to an embodiment of the present invention.
Figure 2:
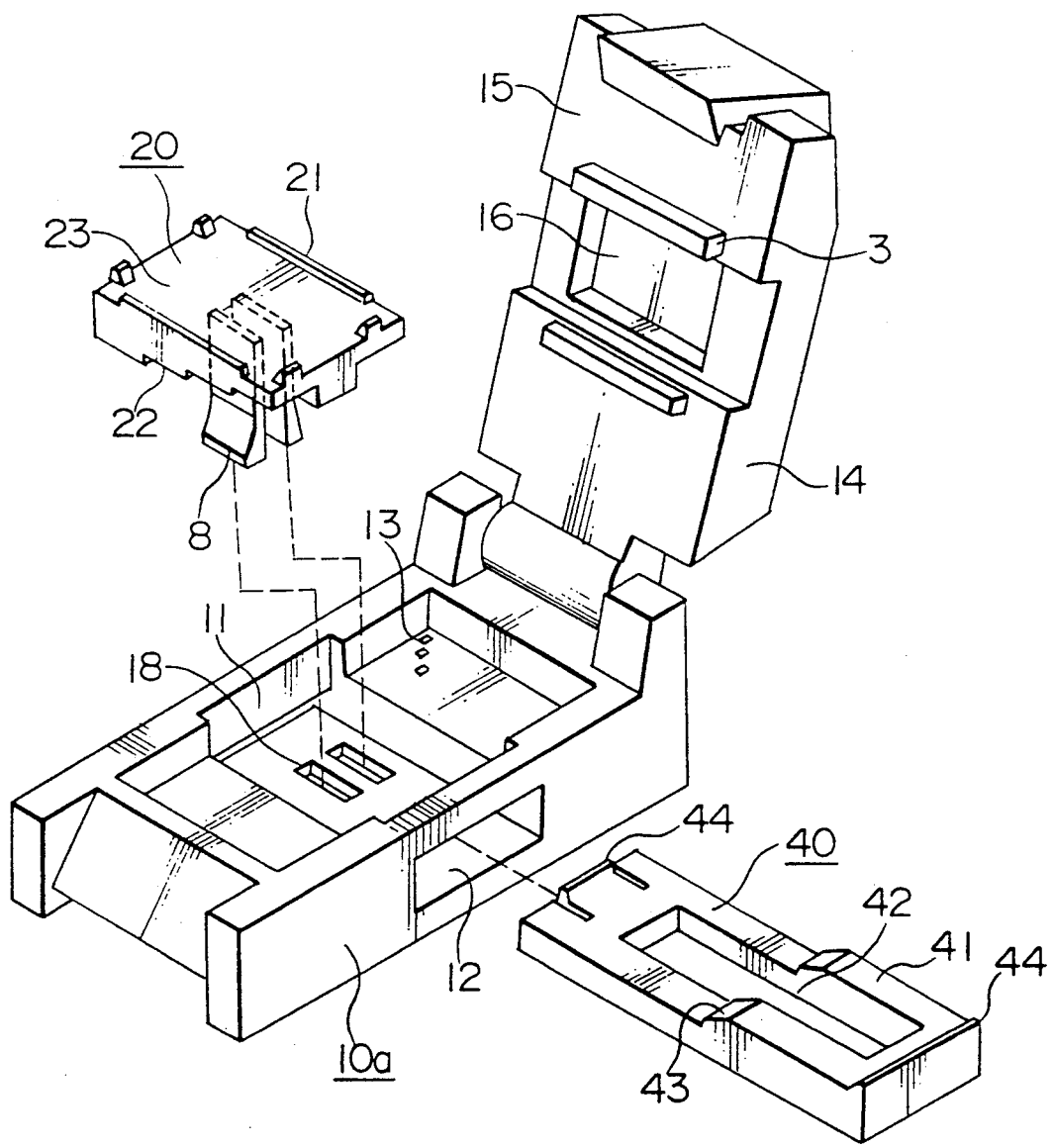
FIG. 2 is an exploded perspective view of the IC socket shown in FIG. 1.

FIG. 1 is a perspective view illustrating an IC socket according to the embodiment of the present invention. FIG. 2 is an exploded perspective view of the IC socket shown in FIG. 1. In this embodiment, an IC socket in which the height of a receiving base can be adjusted in three steps is shown. The receiving base can be used for a regular bend lead type, a flat lead type and a reverse bend lead type as an IC package.

As shown in FIG. 2, a main body portion 10a is made of an electrically insulating resin. Provided in the main body portion 10a are a perpendicular hole 11 which receives and guides a receiving base 20, a horizontal hole 12 which intersects at right angles with the perpendicular hole 11 and which receives and guides a sliding member 40, and mounting holes 13 in which respective contactors 5 are mounted. A recess 16 for receiving an IC package is provided on the inner side of a pressing lid 14, and pressing members 3 for pressing the outer leads of the IC package against the contactors 5 are provided on both sides of the recess 16. The receiving base 20 has a support surface 23 for supporting the IC package (not shown) in such a way that the outer leads (not shown) protrude from both sides of the IC package. The receiving base 20 is movable in a direction perpendicular to the support surface 23 within the perpendicular hole 11 of the main body portion 10a. Positioning means 21 for positioning an IC package are disposed on the support surface 23. A pair of movable pressing claws 8 which extend downward form a stepped bottom surface 22 are disposed on the bottom surface of the receiving base 20.

A plurality of contractors 5 (see FIG. 1) are disposed on both sides of the receiving base 20. A first end of each of the contactors 5 is fitted in a mounting hole 13 and fixed in place. A second end extends toward the receiving base 20 so as to contact the corresponding outer leads of the IC package. In the contactors 5, the second ends are free ends having contact surfaces (not shown) for contacting the outer leads of an IC and have elastic properties such as in a spring.

Figure 9:
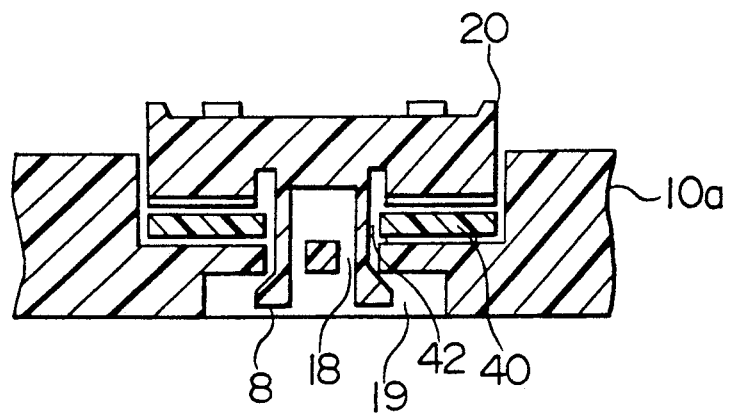
FIG. 9 is a cross-sectional view taken along the line 9—9 of FIG. 1 in which the receiving base is in the lower step.
Figure 10:
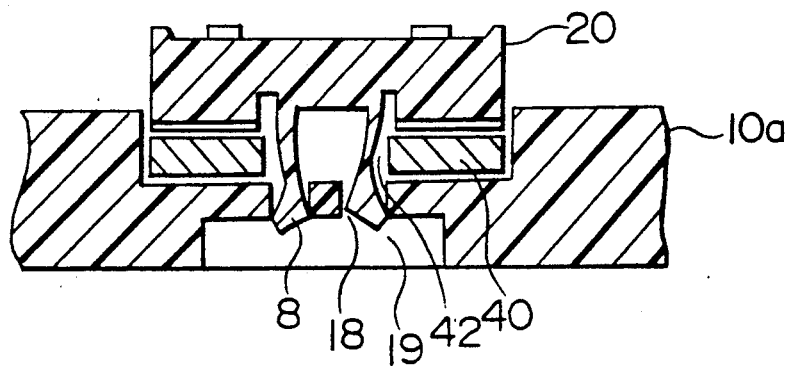
FIG. 10 is a cross-sectional view taken along the line 9—9 of FIG. 1 in which the receiving base is in the upper step.
Figure 11:
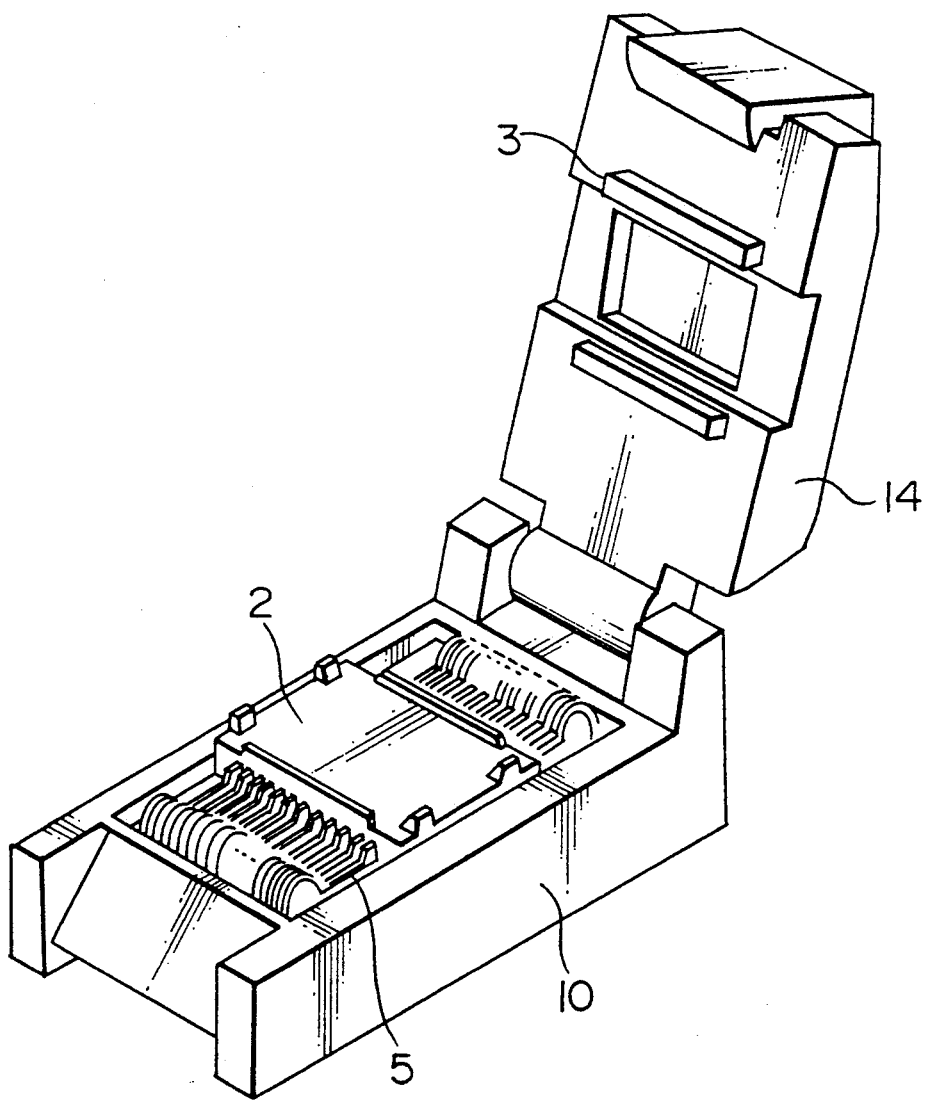
FIG. 11 is a perspective view illustrating a conventional IC socket.

The sliding member 40 is movable horizontally inside the horizontal hole 12 which extends horizontally under the receiving base 20 in the main body portion 10a. The sliding member 40 comprises a stepped top surface 41 which is in abutment with the stepped bottom surface 22 of the receiving base 20; an elongated through hole 42 through which the movable pressing claws 8 pass; a tapered surface 43 for smoothly changing the height of the receiving base 20; and a locking section 44 for preventing the sliding member 40 from being pulled out of the horizontal hole 12. Two slits 18 through which the movable pressing claws 8 pass are disposed on the bottom portion of the perpendicular hole 11 of the main body portion 10a, and a cavity 19, shown in FIG. 9 and 10, is provided below the slits 18.

The supporting means comprises the receiving base 20, and the electrical connection means comprises the contactors 5. The height adjustment means comprises the sliding member 40 and the stepped bottom surface 22 of the receiving base 20. The pressing means comprises the pressing lid 14 and the pressing member 3. The pressing means for pressing the receiving base 20 against the sliding member 40 comprises the slits 18 formed on the bottom of the perpendicular hole of the main body portion, the cavity 19 below the slits 18, elongated through hole 42 provided in the sliding member and the movable pressing claws 8 which extend from the stepped bottom surface of the receiving base.

Figure 3:
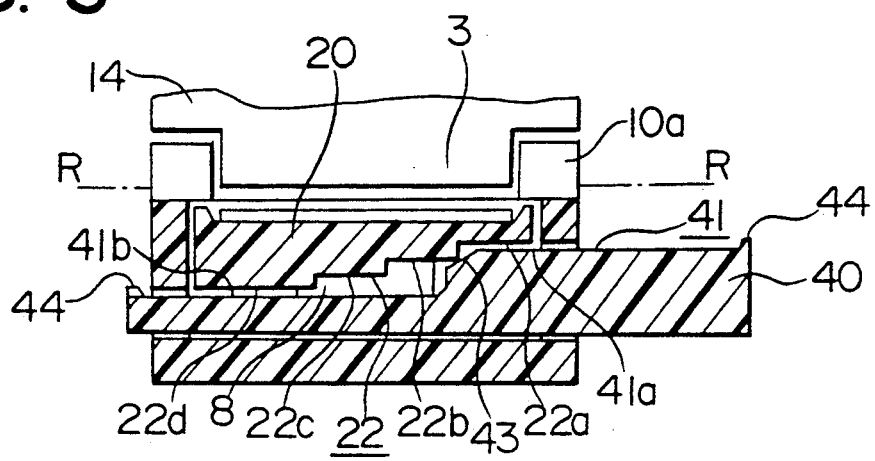
FIG. 3 is a cross-sectional view taken along the line 3—3 of FIG. 1 in which a receiving base is in a lower step.
Figure 4:
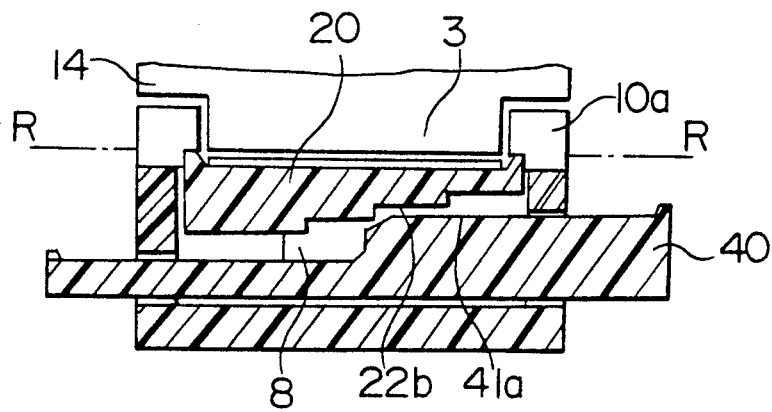
FIG. 4 is a cross-sectional view taken along the line 3—3 of FIG. 1 in which a receiving base is in an intermediate step.
Figure 5:
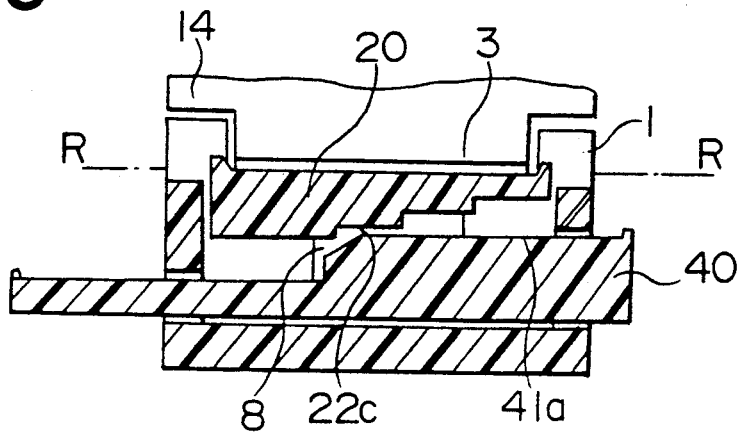
FIG. 5 is a cross-sectional view taken along the line 3—3 of FIG. 1 in which a receiving base is in an upper step.

FIGS. 3, 4 and 5 are cross-sectional views taken along the line 3—3 of FIG. 1. FIG. 3 is a view illustrating a case in which, for example, an IC package of a reverse bend lead type is present when the receiving base 20 is at a lower-step position. FIG. 4 is a view illustrating a case in which an IC package of a flat lead type is present when the receiving base 20 is at an intermediate-step position. FIG. 5 is a view illustrating a case in which an IC package of a regular bend lead type is present when the receiving base 20 is at an upper-step position. As can be seen from these figures, the height of the receiving base 20 can be changed to three by sliding the sliding member 40 by means of four abutment surfaces 22a to 22d provided on the stepped bottom surface 22 of the receiving base 20, two abutment surfaces 41a and 41b provided on the stepped top surface 41 of the sliding member 40 and the tapered surface 43. Although this embodiment shows three steps and the receiving base 20 has four abutment surfaces, at least three abutment surfaces should be provided when the heights of each of the steps and the lengths of each of the abutment surfaces are taken into consideration. These items should be selected during design.

Figure 6:
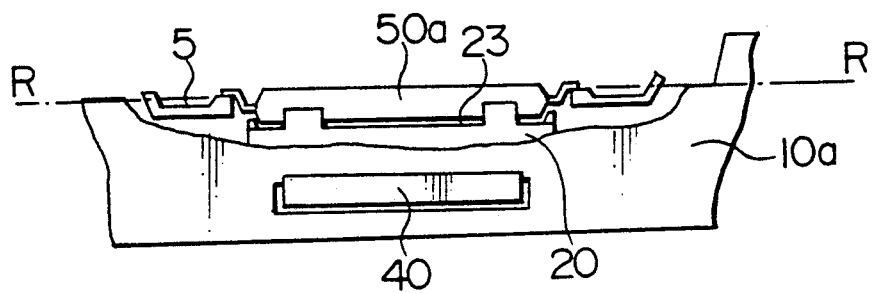
FIG. 6 is a partial side view of the receiving base when a reverse bend lead type IC package is present.
Figure 7:
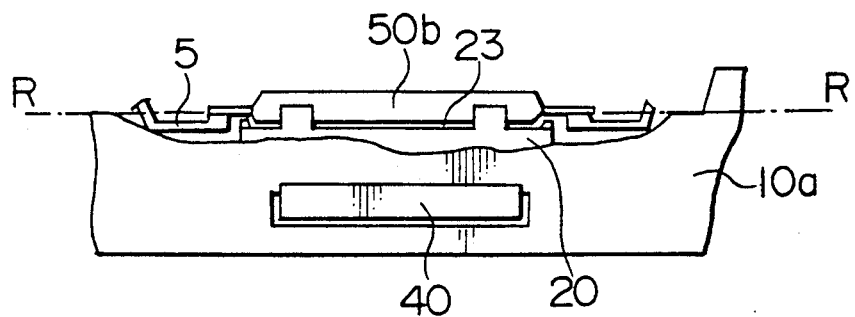
FIG. 7 is a partial side view of the receiving base when a flat lead type IC package is present.
Figure 8:
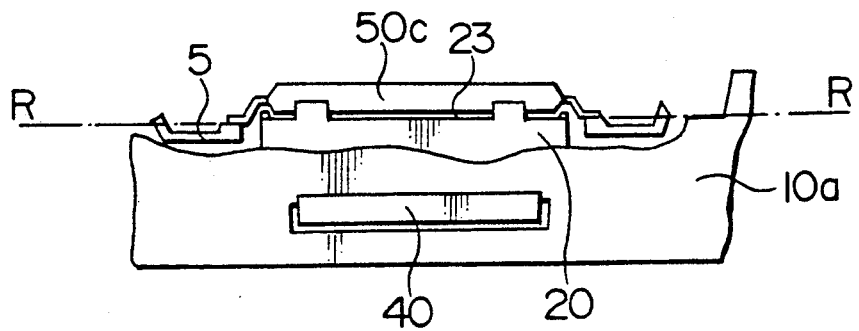
FIG. 8 is a partial side view of the receiving base when a regular bend lead type IC package is present.

FIGS. 6, 7 and 8 are partial side views of the receiving base 20 and the proximity of the contactors 5 in cases where IC packages having the aforesaid three types of outer leads are present, respectively, in which figures the main body portion 10a is shown in a partial cutaway view. FIG. 6 illustrates a case in which a reverse bend lead type IC package 50a is present. FIG. 7 illustrates a case in which a flat lead type IC package 50b is present. FIG. 8 illustrates a case in which a regular bend lead type IC package is present. In FIGS. 3 through 8, the long and short dashed reference line R—R indicates the change of a contact surface (not particularly shown) between the top ends of the contactors 5 and the outer leads.

In the IC socket constructed as described above, as the stepped bottom surface 22 of the receiving base 20 is in abutment with the stepped top surface 41 of the sliding member 40, the height of the receiving base 20 can be changed to three preset positions by sliding the sliding member 40. As a result, the positional relationship between the contactors 5 fixed on the main body portion 10a and the receiving base 20 can be changed in heights.

In FIG. 3, the abutment surface 41a of the sliding member 40 is in abutment with the abutment surface 22a of the receiving base 20. In this condition, if the sliding member 40 is pressed toward the left side of the figure, the receiving base 20 is smoothly and gradually pushed upward by the tapered surface 43 of the sliding member 40. As shown in FIG. 4, the abutment surface 41a of the sliding member 40 is brought into contact with the abutment surface 22b of the receiving base 20. If the sliding member 40 is further pressed toward the left side of the figure, the receiving base 20 is further pushed upward. As shown in FIG. 5, the abutment surface 41a of the sliding member 40 is brought into contact with an abutment surface 22c of the receiving base 20. In this way, the height of the receiving base 20 is changed in three steps while it is being guided by the perpendicular hole 11.

Next, an explanation will be given of the positional relationship between the outer leads of the IC package and the contactors 5 at each height of the receiving base 20.

In FIG. 6, the receiving base 20 is at a lower-step position, and the height of the contact surface of the contactors 5 is above the support surface 23 of the receiving base 20, as indicated by the long and short dashed reference line R—R. Accordingly, if the reverse bend lead type IC package 50a is placed on the support surface 23 with the substrate mounting surface facing upward, electrical contact between the outer leads and the contact surfaces of the contactors 5 can be made.

In FIG. 7, the receiving base 20 is at an intermediate-step position, and the height of the contact surface of the contactors 5 is slightly above the support surface 23 of the receiving base 20, as indicated by the the long and short dashed reference line R—R. Accordingly, if the flat lead type IC package 50b is placed on the support surface 23, electrical contact between the outer leads and the contact surfaces of the contactors 5 can be made as shown.

In FIG. 8, the receiving base 20 is at an upper-step position, and the height of the contact surface of the contactors 5 is almost the same as or slightly below that of the support surface 23 of the receiving base 20, as indicated by the the long and short dashed reference line R—R. Accordingly, if the regular bend lead type IC package 50c is placed on the support surface 23 with the substrate mounting surface facing downward, electrical contact between the outer leads and the contact surfaces of the contactors 5 can be made.

Finally, referring to FIGS. 9 and 10, an explanation will be given of, in particular, the movable pressing claws 8 of the pulling means for pulling the receiving base 20 toward the sliding member 40.

FIGS. 9 and 10 are partial cross-sectional views taken along the line 9—9 of FIG. 1, illustrating states in which the receiving base 20 is in the lower step and in the upper step, respectively. As described above, the pulling means comprises a pair of slits 18 formed on the bottom of the perpendicular hole 11 of the main body portion 10a; the cavity 19 below the slits 18; the elongated through hole 42 provided in the sliding member 40; the pair of movable pressing claws 8 which extend from the stepped bottom surface 22 of the receiving base 20 through the elongated through hole 42, and the slits 18 into the cavity 19.

In the state of FIG. 9 in which the receiving base 20 is in the lower step, the movable pressing claws 8 do not change their forms and maintain the predetermined position of the receiving base 20. In the state of FIG. 10 in which the receiving base 20 is, for example, in the upper step, the two movable pressing claws 8 change their forms in a direction in which they come nearer to each other by the actions of the inclined surface provided on the outside of these claws and the slits 18. In this state, the two movable pressing claws 8 try to return to their original state as a result of the elastic properties of these movable pressing claws 8. The receiving base 20 is pulled downward, i.e., toward the sliding member 40, by the action of the resulting force by the two movable pressing claws 8 moving away from each other. As a result, the state in which the abutment surfaces of the receiving base 20 and the sliding member 40 abut each other is stably ensured. Furthermore, since a downward pulling force is given to the receiving base 20 when the receiving base 20 is moved upward and downward, the receiving base 20 does not become inclined and get caught inside the perpendicular hole 11, and thus a more stable upward and downward movement of the receiving base 20 is ensured. In addition, the movable pressing claws 8 and the slits 18 through which the movable pressing claws 8 pass guide the receiving base 20.

The outer leads of the IC package are pressed against the contact surfaces of the corresponding contactors 5 by pressing member 3 disposed on the inner surface 15 of the pressing lid 14. Since the contactors 5 have elastic properties, they are deformed downward by an amount proportional to the pressure applied. As a result, contact between the outer leads and the contactors 5 is stably ensured.

Although in the above-described embodiment the height of the receiving base is changed between three steps depending upon which of the three types of outer leads of the IC package are employed, the present invention is not limited to this case. For example, the present invention can be applied to a case in which the height of the receiving base is changed between a plurality of steps depending upon other elements, such as the thickness of the package section.

As has been explained above, according to the IC socket of the present invention in which the height of the receiving base on which an IC package is placed can be changed between a plurality of steps depending upon the shape of the outer leads of the IC package, so that it is possible to use just one IC socket for IC packages whose outer leads are different from each other.

What is claimed is:

1. An IC socket on which an IC having a package and a plurality of outer leads extending from the package is mounted for establishing electrical connections with the IC comprising:

a main body;

a receiving base disposed in the main body, having a supporting surface for supporting an IC package with a plurality of leads extending beyond the supporting surface, and movable within the main body perpendicular to the supporting surface;

electrical connection means for making electrical connections to leads of an IC having a package supported by the supporting surface;

height adjustment means for changing the height of the supporting surface relative to the main body in a plurality of steps, the height adjustment means including a stepped bottom surface on the receiving base and a sliding member disposed in the main body movable parallel to the supporting surface and having a stepped top surface and an oblique surface for abutment with the stepped bottom surface; and pressing means for pressing the outer leads of an IC package supported on the supporting surface against the electrical connection means.

2. An IC socket according to claim 1 wherein the electrical connection means comprises a plurality of resilient contactors disposed adjacent the receiving base at positions corresponding to positions of respective leads of the IC package, the main body is an electrically insulating resin and includes a first hole receiving and guiding the receiving base and a second hole receiving and guiding the sliding member and intersecting the first hole at a right angle, and the pressing means comprises an openable and closable pressing lid having an inner surface for covering the receiving base and the contactors and a pressing member for pressing each of the leads of the IC package against the corresponding contactors.

3. An IC socket according to claim 2 wherein the stepped bottom surface of the receiving base has at least three stepped surfaces and the stepped top surface of the sliding member has at least two stepped surfaces and an oblique surface between the two stepped surfaces, wherein the height of the receiving base relative to the main body can be adjusted in three steps by sliding the sliding member.

4. An IC socket according to claim 3 wherein the height of the receiving base can be changed in accordance with the shape of the outer leads of an IC by sliding the sliding member.

5. An IC socket according to claim 2 wherein the IC package has outer leads on two opposite sides and the contactors are disposed on opposite sides of and adjacent to the receiving base.

6. An IC socket according to claim 2 comprising pulling means for pulling the receiving base toward the sliding member to ensure contact between the stepped bottom surface and the stepped top surface.

7. An IC socket according to claim 6 wherein the pulling means comprises a pair of slits on the bottom of the main body, a cavity below the slits in the main body, an elongated through hole in the sliding member, and movable pressing claws extending form the stepped bottom surface of the receiving base through the cavity and the slits into the cavity.

* * * * *